US012541626B2

(12) United States Patent
Nawari et al.

(10) Patent No.: US 12,541,626 B2
(45) Date of Patent: Feb. 3, 2026

(54) VIRTUAL REVIEW SYSTEM FOR LAND DEVELOPMENT

(71) Applicant: University of Florida Research Foundation, Inc., Gainesville, FL (US)

(72) Inventors: Nawari O. Nawari, Gainesville, FL (US); Sabrina A. Dugan, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 234 days.

(21) Appl. No.: 18/540,459

(22) Filed: Dec. 14, 2023

(65) Prior Publication Data

US 2024/0202379 A1 Jun. 20, 2024

Related U.S. Application Data

(60) Provisional application No. 63/387,646, filed on Dec. 15, 2022.

(51) Int. Cl.
*G06F 30/13* (2020.01)
*G06F 30/27* (2020.01)

(52) U.S. Cl.
CPC .............. *G06F 30/13* (2020.01); *G06F 30/27* (2020.01)

(58) Field of Classification Search
CPC ................................ G06F 30/13; G06F 30/27
USPC .............................................................. 703/1
See application file for complete search history.

(56) References Cited

U.S. PATENT DOCUMENTS

| | | | | |
|---|---|---|---|---|
| 11,113,310 | B2 * | 9/2021 | Jalla | G06F 30/13 |
| 2008/0059220 | A1 * | 3/2008 | Roth | G06Q 50/18 705/317 |
| 2009/0125283 | A1 | 5/2009 | Conover | |
| 2012/0130914 | A1 * | 5/2012 | Kinghorn | G06Q 30/018 705/317 |

(Continued)

FOREIGN PATENT DOCUMENTS

| | | | |
|---|---|---|---|
| KR | 102118586 | B1 | 6/2020 |
| WO | 2022077067 | A1 | 4/2022 |
| WO | 2022165483 | A1 | 8/2022 |

OTHER PUBLICATIONS

International Search Report and Written Opinion mailed on Apr. 4, 2024 for PCT Patent Application No. PCT/US2023/83999. Copy Provided.

*Primary Examiner* — Andre Pierre Louis
(74) *Attorney, Agent, or Firm* — Thomas | Horstemeyer, LLP

(57) ABSTRACT

The present disclosure presents systems and methods for automated determination of development code performance. One such method, among others, comprises storing, by a computing device, land development design data in a building information model (BIM) file or a Computer Aided Design (CAD) file, wherein the BIM or the CAD file comprises a permit application file having a design for the land development project; checking, by the computing device, the permit application file for code compliance with computable files defining land development codes; generating, by the computing device, an output report indicating whether the permit application file has passed a check for the code compliance; and transmitting, by the computing device, the output report to a client device of an applicant associated with the permit application file.

18 Claims, 10 Drawing Sheets

(56) References Cited

U.S. PATENT DOCUMENTS

| | | | |
|---|---|---|---|
| 2018/0322597 | A1 | 11/2018 | Sher |
| 2020/0258174 | A1 | 8/2020 | Rodriguez |

* cited by examiner

SECTION R304
MINIMUM ROOM AREAS

R304.1 Minimum area.

Habitable rooms shall have a floor area of not less than 70 square feet (6.5 $m^2$).

Exception: Kitchens.

R304.2 Minimum dimensions.

Habitable rooms shall be not less than 7 feet (2134 mm) in any horizontal dimension.

Exception: Kitchens.

R304.3 Height effect on room area.

Portions of a room with a sloping ceiling measuring less than 5 feet (1524 mm) or a furred ceiling measuring less than 7 feet (2134 mm) from the finished floor to the finished ceiling shall not be considered as contributing to the minimum required habitable area for that room.

FIG. 8

VIRTUAL REVIEW SYSTEM FOR LAND DEVELOPMENT

CROSS-REFERENCE TO RELATED APPLICATION

This application claims priority to U.S. provisional application entitled, "Virtual Review System for Land Development," having application No. 63/387,646, filed Dec. 15, 2022, which is entirely incorporated herein by reference.

TECHNICAL FIELD

The present disclosure is generally related to virtual permitting systems using building information models.

BACKGROUND

Stakeholders investing in the land development have progressively been requiring the government authorities to issue land development permits in a shorter time. However, the permitting process is primarily manual and time consuming. The permitting process automation still presents a challenge to the land development and civil infrastructure industry since many of the land development standards and regulations are in textual format.

The land development review generally checks compliance with the land development code and assesses a project's impacts on its immediate neighborhood and on the city or county. Accordingly, land development review ensures that infrastructure on a certain property is properly installed and that environmental impacts during and after construction are mitigated. Depending upon the proposed land development project's size, location and use, the review may address the influences on traffic and parking, environmental protection, the design character of the area, historic buildings, and infrastructure systems (water, sewer, roads, bridges, and other public facilities and other services). Depending upon the project's impacts, the developer may be required to change the project's design or to take other measures to mitigate those impacts.

The typical permitting process of land development projects involves the reviews of different planning, zoning, and engineering design domains. There is a need to synthesize the review process across various related fields, rules, and responsibilities and to integrate review elements into a unified Virtual Permitting System (VPS). The results depict that the VPS can reduce the cost by 90 percent in comparison to the current review and permitting processes. The time saving achieved is about 70 percent. The System integrates with blockchain technologies to improve cybersecurity, accountability, and reliability.

Exemplary U.S. Patent documents in the prior art include the following. U.S. Pat. No. 4,964,060 for "COMPUTER AIDED BUILDING PLAN REVIEW SYSTEM AND PROCESS" by Charles H. Hartsog, filed Dec. 4, 1985, describes a method of reviewing building plans against building regulations and codes using LISP and PROLOG programing languages and based on inductive reasoning and inference chain.

U.S. Pat. No. 10,074,145 for "METHODS FOR THE TRANSFORMATION OF COMPLEX ZONING CODES AND REGULATIONS TO PRODUCE USABLE SEARCH" by Leigh Budlong, filed Jun. 30, 2014, describes a method of a computer-implemented application that automates answers to zoning and real estate development questions. This patent involves transforming zoning codes, real estate data, and municipal regulations into searchable usable data. The disclosed methods involve analyzing zoning codes and real estate regulations, transforming these complex regulations into a structured data format, creating rule modules that represent different aspects of the zoning codes, incorporating real estate data and municipal regulations data, making this data searchable from a user's perspective, focusing on usability and accessibility, structuring zoning and real estate regulations into a more accessible format, creating rule modules, each representing different aspects of these regulations, and integrating real estate data with these rule modules, such that the patent aims to design a system to interpret and respond to user queries based on this structured data.

U.S. Pat. No. 11,798,110 for "SYSTEMS AND METHODS FOR DETERMINING LAND USE DEVELOPMENT POTENTIAL" by Max Enrique Zabala Rodriguez, filed Feb. 13, 2020, describes a Graphical User Interface (GUI) for real-time analysis, implementing search functions, and providing real-time feedback and recommendations for land use development potential. The disclosed system aids in adjusting land use development plans to comply with environmental and regulatory requirements. The system includes a computing platform with various modules, such as a search module, analytics module, and compliance module, designed to collect, analyze, and transmit data related to geographic areas of interest; a GUI that enables users to interact with the system, receive data, display 3D models, and provide real-time updates based on changes in geographic data; the ability to generate building analysis data including maximum actual building potential, which encompasses factors like maximum lot capacity, density, and building area; real-time analysis capabilities that allow the system to provide instant feedback on whether land meet regulatory requirements, with color-coded visualizations; and features for user customization and analysis of potential land development, considering environmental and regulatory measures, and the impact on utility services.

SUMMARY

Embodiments of the present disclosure systems and methods for automated determination of development code performance. One such system comprises at least one processor and memory configured to communicate with the at least one processor. The memory stores instructions that, in response to execution by the at least one processor, cause the at least one processor to perform operations comprising storing, by a computing device, a design data file for a land development project, wherein the design data file comprises a BIM file or a CAD (Computer Aided Design) file, wherein the design data file comprises a permit application file having a design for the land development project; checking, by the computing device, the permit application file for code compliance with computable files defining land development codes; generating, by the computing device, an output report indicating whether the permit application file has passed a check for the code compliance; and/or transmitting, by the computing device, the output report to a client device of an applicant associated with the permit application file.

The present disclosure can also be viewed as a method for automated determination of development code performance. One such method comprises storing, by a computing device, land development design data in a building information model (BIM) file or a Computer Aided Design (CAD) file, wherein the BIM or the CAD file comprises a permit application file having a design for the land development project; checking, by the computing device, the permit application file for code compliance with computable files defining land development codes; generating, by the computing device, an output report indicating whether the permit application file has passed a check for the code compliance; and/or transmitting, by the computing device, the output report to a client device of an applicant associated with the permit application file.

The present disclosure can also be viewed as a non-transitory, tangible computer-readable storage medium having instructions stored thereon that, in response to execution by a computer-based system, cause the computer-based system to perform operations comprising: storing a design data file for a land development project, wherein the design data file comprises a BIM file or a CAD (Computer Aided Design) file, wherein the design data file comprises a permit application file having a design for the land development project; checking the permit application file for code compliance with computable files defining land development codes; generating an output report indicating whether the permit application file has passed a check for the code compliance; and/or transmitting the output report to a client device of an applicant associated with the permit application file.

In one or more aspects for such systems, methods, and/or computer-readable storage mediums, the computing device comprises a blockchain node, wherein the land development design data file is stored by one or more blockchain nodes in a distributed ledger network, wherein the permit application file is checked for code compliance in accordance with one or more Smart Contracts (SCs) of the distributed ledger network; the checking operation is performed using artificial intelligence techniques; the checking operation is performed using Smart Contracts (SCs) that employ machine learning, natural language processing (NLP), computer vision, and fuzzy logic techniques performed by at least one processor; a format of the BIM or CAD file comprises an Autodesk Revit format, an Autodesk DWG format, a DXF (Drawing Exchange Format) format, a STL (Stereolithography) format, a PDF (portable document format) format, or an IFC (Industry Foundation Classes) data format; a rules and regulations data file is stored by the one or more blockchain nodes in a distributed ledger network, wherein the rules and regulations data file comprises a computable data model defining land development codes and regulations; and/or the design data file and the rules and regulations data file are stored by the one or more blockchain nodes in the distributed ledger network.

In one or more aspects, such systems, methods, and/or computer-readable storage mediums involve storing, by the computing device, a rules and regulations data file for the land development project, wherein the rules and regulations data file comprises a computable data model defining land development codes and regulations; storing a second design data file for the land development project, wherein the second design data file comprises a second permit application file having a design for a civil infrastructure project related to the land development project; checking, by the computing device, the second permit application file for code compliance with computable files defining land development codes and regulations; wherein the computing device comprises one or more blockchain nodes, wherein the land development design data in the BIM or CAD file and the rules and regulation data file are stored by the one or more blockchain nodes in a distributed ledger network; acquiring zoning, planning, landscape, environmental, utilities, storm water and drainage, water supply and wastewaters, photometric, and road design details of the land development from the second design data file; acquiring a current progress of the land development details from the second design data file; and/or checking for current land development code compliance by comparing the current progress with the land development details from the rules and regulations data file.

Other systems, methods, features, and advantages of the present disclosure will be or become apparent to one with skill in the art upon examination of the following drawings and detailed description. It is intended that all such additional systems, methods, features, and advantages be included within this description and be within the scope of the present disclosure.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 8 shows an example of regulatory code provisions.

DETAILED DESCRIPTION

In the present disclosure, systems, methods, and non-transitory computer-readable media are disclosed for automated determination of development code performance, such as but not limited to automated site development-related land development and civil infrastructure reviews conducted by counties and cities.

Accordingly, the present disclosure presents a new Virtual Permitting System (VPS) and related methods for land development and/or civil infrastructure that automates and semi automates the regulations and standards review process. In various embodiments, the VPS is centered on Building Information Models (BIM) and the Generalized Adaptive Framework (GAF) and ASSHTO (American Association of Highway and Transportation Officials) specifications. The results depict that the VPS can reduce the cost by 80-90 percent in comparison to the current permitting process. The time saving achieved is about 70 percent. In various embodiments, an exemplary VPS system integrates with block chain technologies to improve cybersecurity, accountability, and reliability. This system will also eliminate personal bias from the review process.

The Land Development Plan review process is typically divided into Preliminary and Final reviews. Preliminary Development Plans provide a general layout of the proposed project at a lower level of detail than that required for Final Plans. Final Development Plans provide the detailed engineering and construction drawings, which can include civil infrastructure permitting and review.

A part of a preliminary site development review, the site plan or design is reviewed which typically can take a duration of 3-4 months in conventional review systems. For example, as part of the preliminary site development review for land development, land use and zoning proposals can be considered in addition to landscape, environmental, and transportation considerations. For example, a landscape plan, neighborhood workshops, and utility plan may also be reviewed and considered.

Figure 1A:
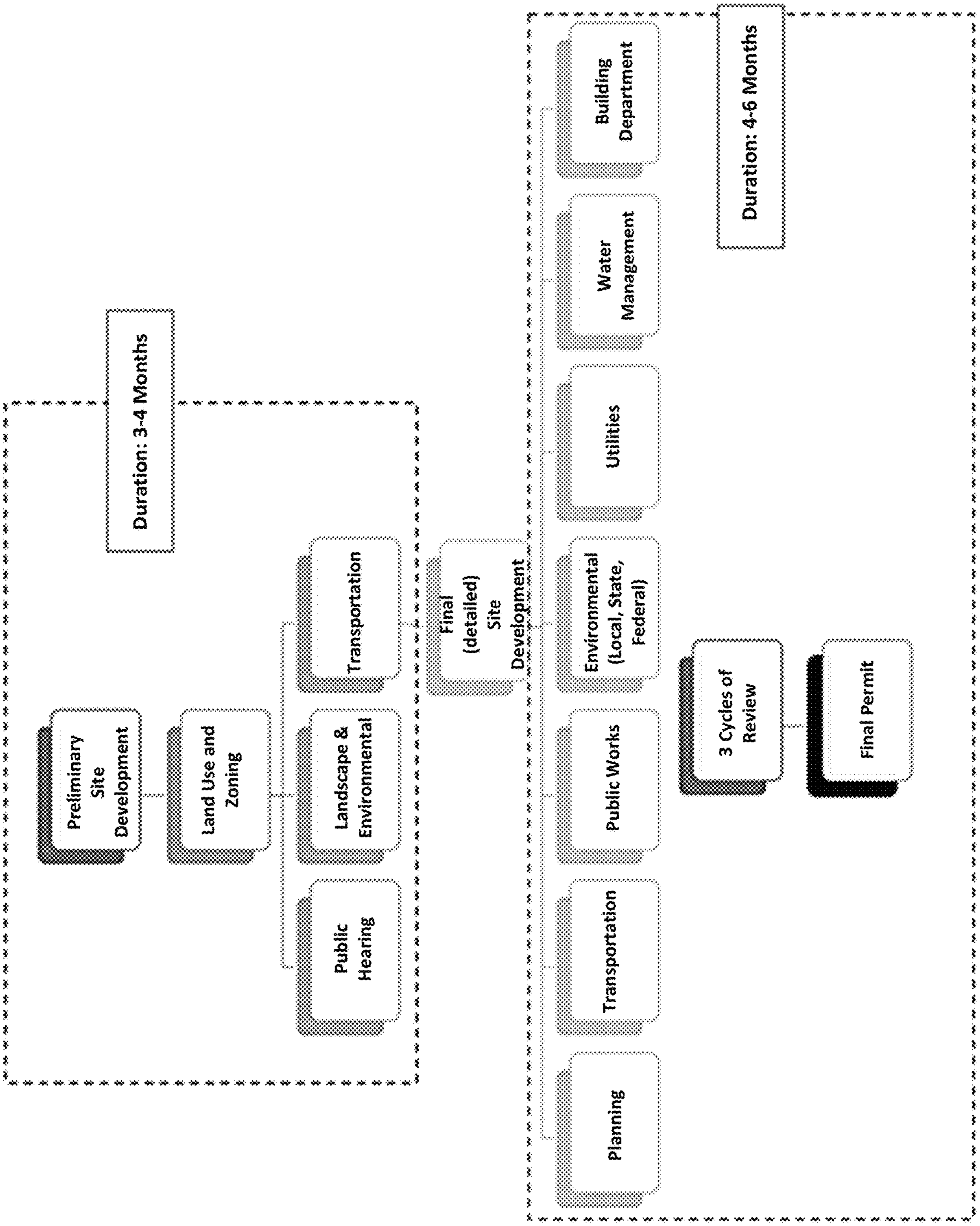
FIGS. 1A-1B illustrate the components of the preliminary and final land development plan review.

Accordingly, FIG. 1A illustrates the components of the preliminary land development plan review. They cover the concept, development data and programs, zoning, landscape, environmental, buffers, traffic, streets networks, parking and related aspects. Also, this phase of the land development review includes the neighborhood public workshop to collect the input of the local community where the development is taking place. The proposed VPS for land development will reduce the time to complete this phase of the review by more than 60%.

Figure 1B:
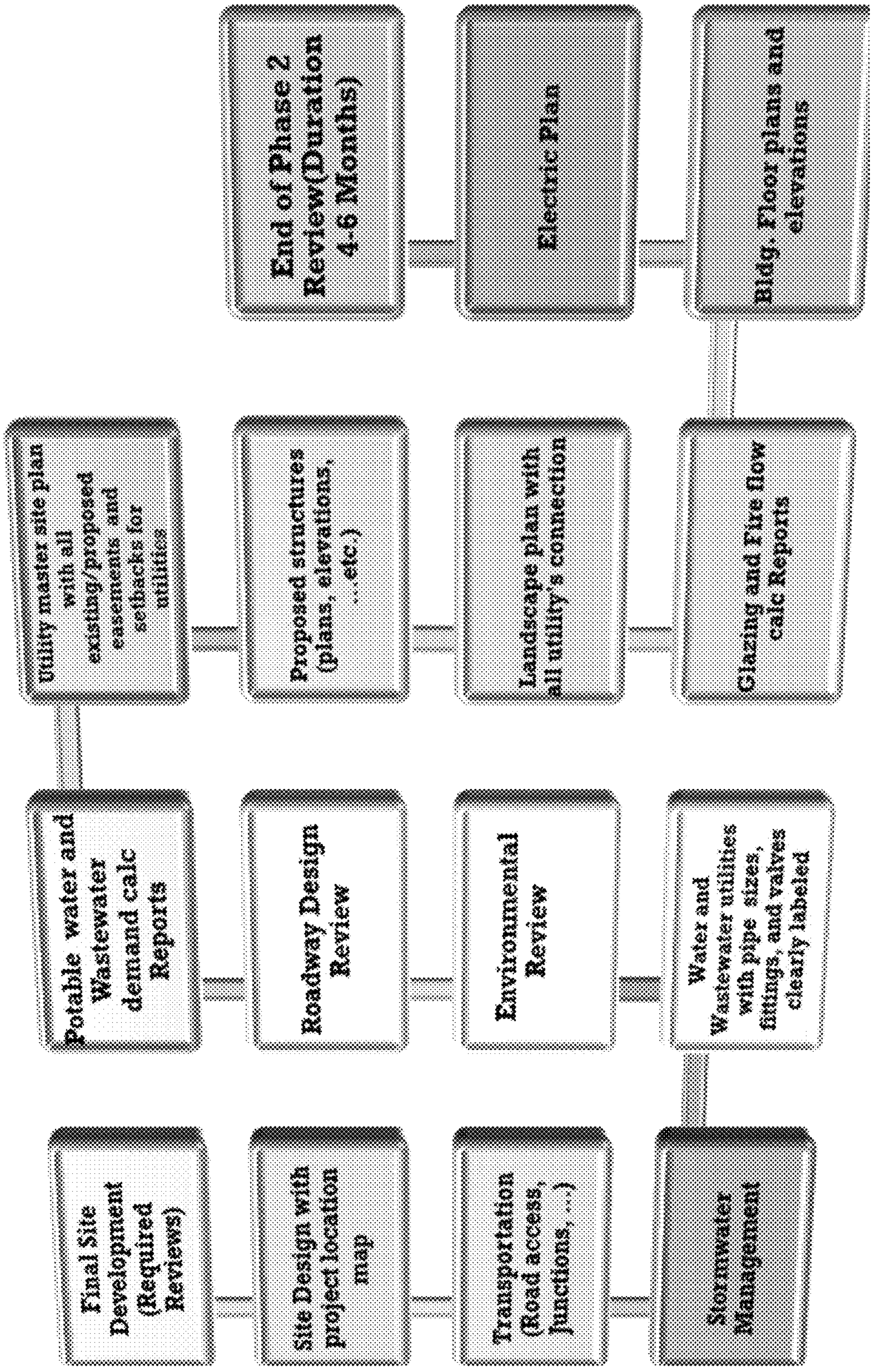

FIGS. 1A and 1B also depict the second or final phase of the land development review. This phase encompasses the review of the detailed design for the proposed land development. The proposed VPS will reduce the time to finish this part of the review process by more than 80%. As part of the final site development review, a detailed site design is reviewed and considered which can typically take 4-6 months' time. A final site plan include civil infrastructure work that is to be done on the site. During this review for land development, planning, applicable regulations and codes for and/or the impact on transportation, public works, environmental factors (local, state, federal), utilities, water management, and building factors are considered. During this review for civil infrastructure, the site design with project location map, transportation plan, stormwater management plan, potable wastewater demand calculation reports, roadway design review, environmental review, water supply and wastewater utilities plan, photometric design, detailed utility master site plan, proposed structures, detailed landscape plan, glazing and fire flow calculation reports, building floor plans and elevations, and electric plan may be reviewed and considered which can typically take 4-6 months' time.

Under a traditional land development review, information is communicated graphically or textually, where there is no relationship between objects and variable, no database or computable rules, and no real-time feedback can be obtained by changing any of the variables, which makes the overall process time consuming.

Correspondingly, a preliminary site development review process performed using an exemplary VPS system can take no more than ¼ to ⅓ of the time of the conventional process. For example, an exemplary VPS system and related methods can accept project data as input, analyze the project data using VPS algorithms, and generate/output comprehensive compliance reports, where certain reports or outcomes are parameter driven with real-time feedback. Project data can include BIM models of site plans, transportation plans, rail plans, utilities plans, proposed structures, landscape plans, building plans, etc. Accordingly, model simulations may be performed using the provided model data and various models can be integrated into one another. As an example, civil 3D model of a site plan can include and be integrated with a construction model (e.g., Revit model) of a building that is planning to be located in the site plan. Civil infrastructure design documents include site design, road and highway design, and rail design. Site design encompasses survey, terrain, corridor modeling, stormwater and sanitary sewers, Geotech, etc. Road and highway design encompasses rural highway, urban freeways, horizontal and vertical alignment, bridges, etc. Rail design encompasses platform design, single or dual platform subassemblies, alignments, rail track, tunnels, etc.

Figure 2A:
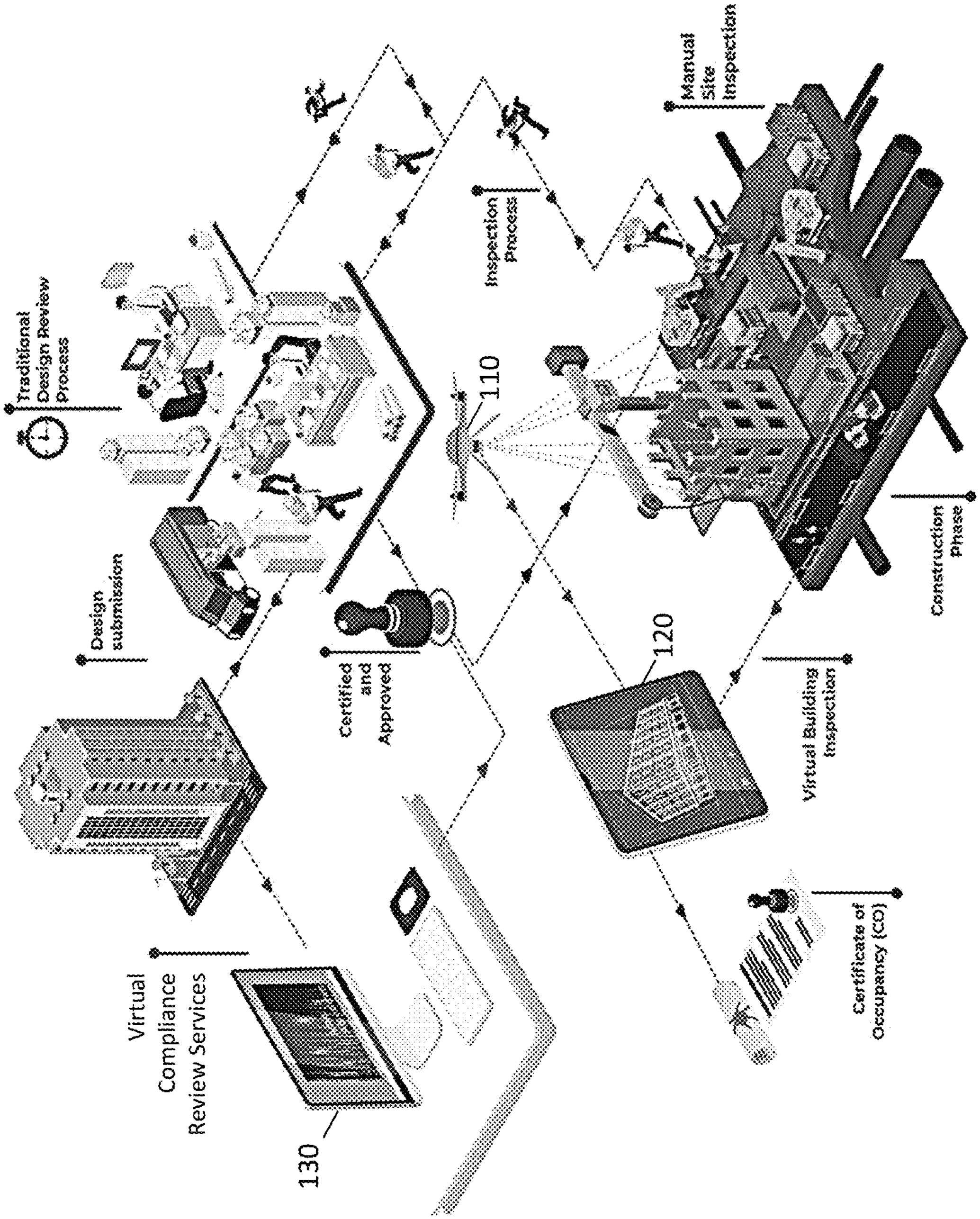
FIGS. 2A-2B show an overview of building permitting processes from conventional processes to an exemplary virtual permitting process in accordance with embodiments of the present disclosure.

FIG. 2A shows an overview of permitting processes from conventional processes to an exemplary virtual permitting process in accordance with embodiments of the present disclosure. Conventional permitting process generally require manual submissions, inspections, and/or reviews, which creates a slow permitting process for issuing permits. Accordingly, traditional design review processes may take three to four weeks and often longer than that to finish the review and issue the applicable permit. For conventional design submissions, owner(s), contractor(s), architect(s), and/or engineer(s) need to submit the design drawings to the building authority to review them and make sure all the code regulations are followed. Building officials in each city and county may then start to manually review these drawings. After the local municipality issues the applicable permit, the construction phase can begin, such as those involving civil infrastructure. As such, the entire permitting process is timely and resource consuming.

Further, FIG. 2A depicts the traditional land development permitting process. It involves preliminary review and final review. The Preliminary Development Plans provide the main concept and a general layout of the proposed project at a lower level of detail than that required for Final Plans. Final Development Plans provide high level detail of the project including planning, zoning, engineering and construction drawings. The duration of the preliminary review, using the traditional (current) approach, is on average between 2-4 months, while the detailed land development plans review takes about 4-8 months with a minimum of tree cycles of reviews.

Figure 2B:
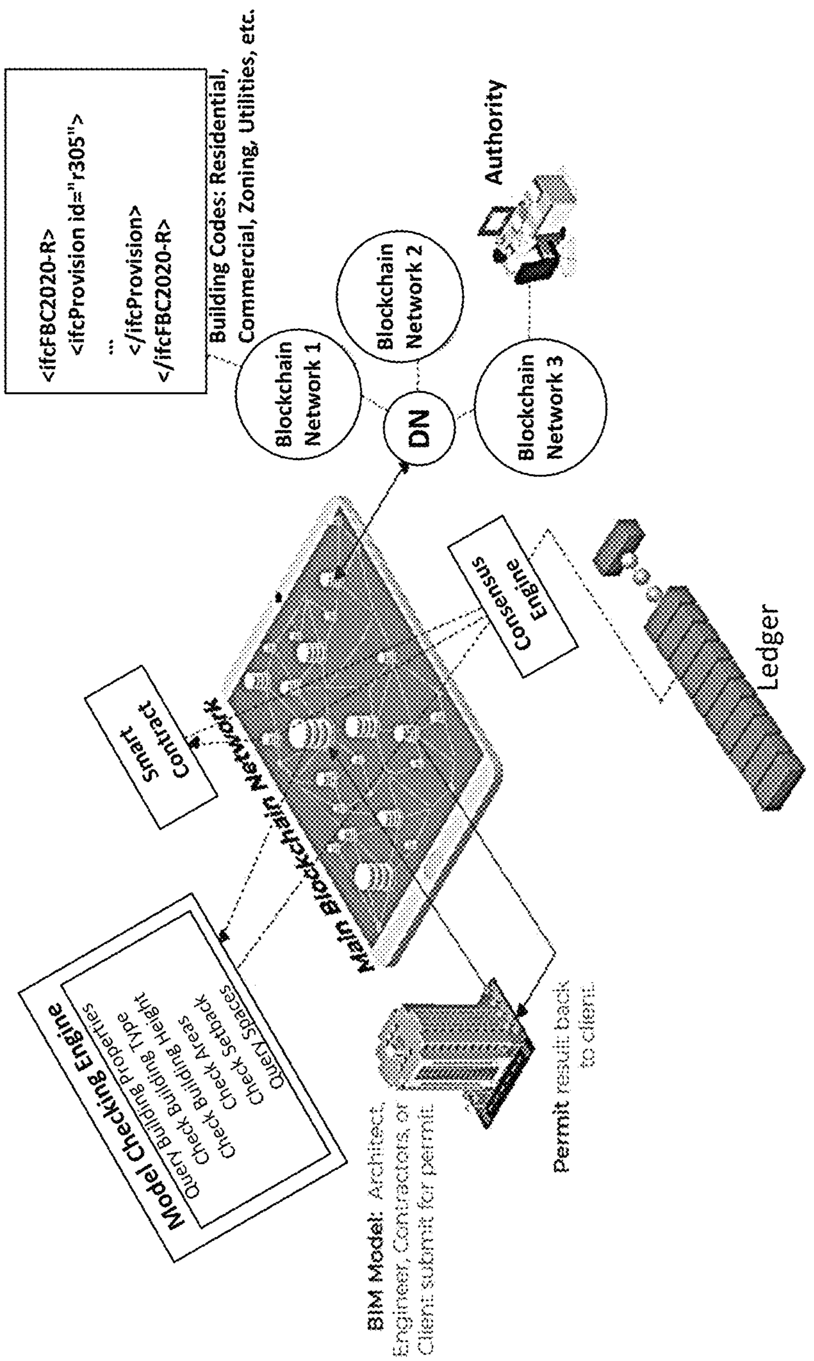

In various embodiments, an exemplary VPS system utilizes a distributed ledger technology (DLT) platform or network is used to store the BIM model data and associated algorithms on a secured distributed and encrypted platform. In various embodiments, a DLT-based framework for the Virtual Permitting System (VPS) is based on the Generalized Adaptive Framework (GAF), Smart Contracts (Chaincode) for screening models and updating the ledger, model checking, and consensus engines, as illustrated in FIG. 2B. An exemplary DLT-based framework for VPS can expand the capabilities of the VPS by introducing secure identification and authentication of participants and establishes a ubiquitous and reliable infrastructure that serves as a repository for data storage, as well as a consistent platform that facilitates data exchanges during the virtual permitting process. Key characteristics of DLT, such as using secure cryptography, asset sharing, examining trails of data access, immutability, and a robust peer-to-peer network, pose an innovative and promising approach to extending and augmenting the VPS.

As discussed, permit review is the process of evaluating a proposed design against its building codes and regulations to verify the quality and performance of the design and identify issues before construction takes place. Typically, counties and/or cities of the United States have one or more departments established to oversee land development and building construction, where one can submit building documents, such as an application for a land development or civil infrastructure permit.

In a typical distributed ledger technology (DLT) network, the entire processing and storage of data are performed in nodes that are hosted and supervised by local stakeholders. Also, the changes applied to the data are made implicitly immutable by appropriate cryptographic linking. This offers a sequential record of the following state(s) the data is in, along with the individual changes, in a transparent way. The progression over time can be recorded in more detail with the attachment of timestamps to individual modifications. DLT relies on consensus building, which refers to algorithms that enforce the data's validity and changes and replicated on multiple distributed nodes in the network.

Given the multi-disciplinary nature of a BIM project with teams who may belong to different organizations and considering other project participants with varying levels of functions and privileges, a permissioned DLT is most suitable for a collaborative BIM environment. Thus, in various embodiments, an exemplary blockchain network utilizes a Hyperledger Sawtooth (HLS) framework, among others, since it relies on a permissioned blockchain. A permissioned blockchain relies on the identities of its peers and provides a way to protected data exchanges between groups of entities who share a mutual goal, although they have intellectual properties that they need to secure while exchanging data. In various embodiments, the permissioned blockchain network can use the traditional Byzantine-fault tolerant (BFT) consensus mechanisms.

The Hyperledger Sawtooth (HLS) is based upon modular and extensible architectures. An example of exemplary modules that can be plugged in and implemented in Hyperledger include:

- Membership services: This module deals with a permissioning and serves to create a root of trust during network formation. Also, this module is vital in managing the identity of members participating in the blockchain network. It provides a specialized digital certificate authority for issuing certificates to members of the BC network;
- Chaincode services: A chaincode or smart contract is an application-level code stored on the ledger as a part of a transaction. Chaincode runs transactions that may modify the data on the ledger. Business logic is written as chaincode (often in the Go or Java languages). Chaincode is installed on network members machines, which require access to the asset states to perform reads and writes operations. The chaincode is then instantiated on particular channels for specific peers. Ledgers are normally shareable across entire networks of peers or include only a specific set of participants. Peers can participate in multiple BC (blockchain) channels;
- Consensus services: These services are at the heart of any blockchain application. They enable a trust system. The consensus service permits digitally signed transactions to be proposed and validated by network members. The consensus is normally pluggable and tightly linked to the endorse-order validation model that the Hyperledger proposes. The ordering services in HLS represent the consensus system. The ordering service groups multiple transactions into blocks and outputs a hash-chained sequence of blocks containing transactions.

Figure 3:
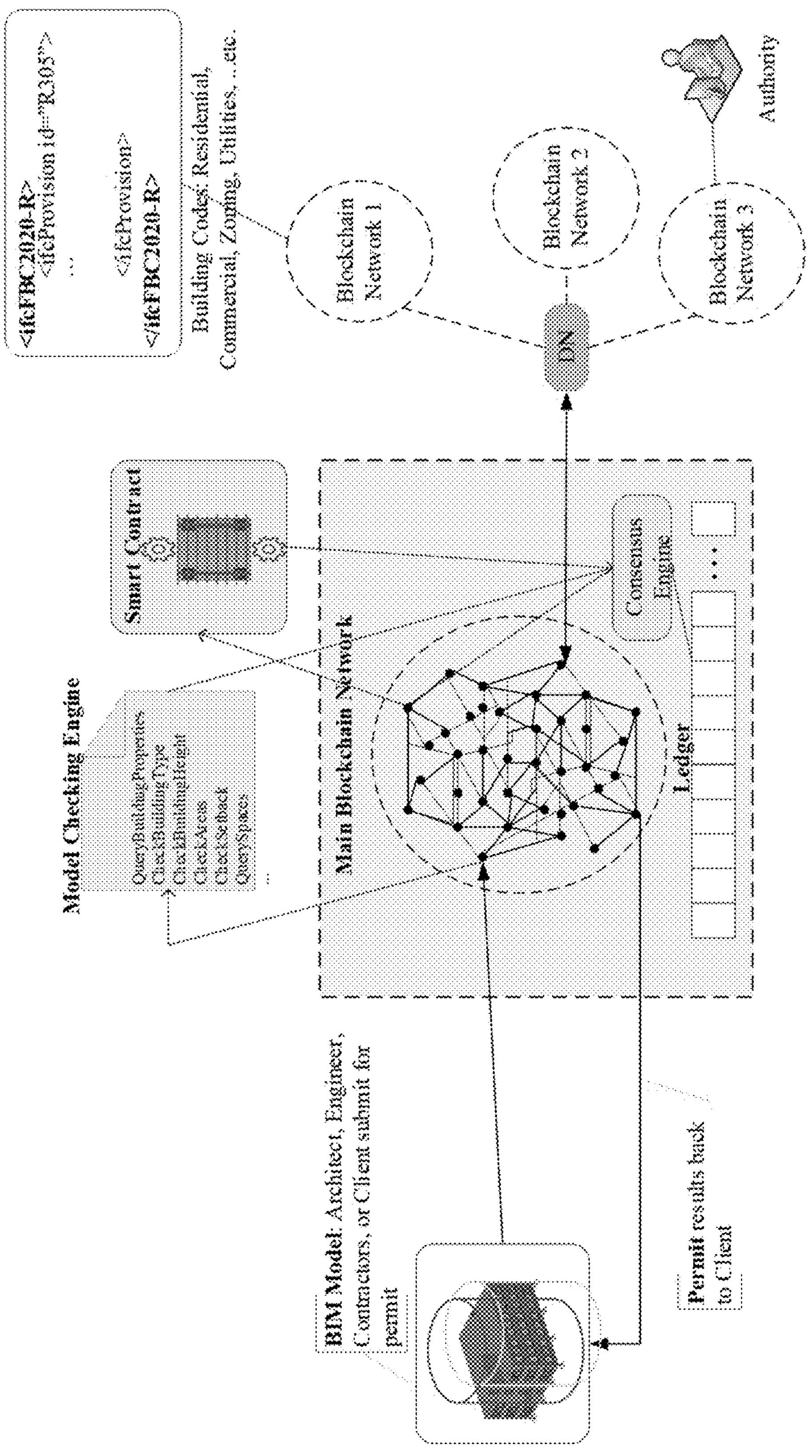
FIG. 3 shows an overview of an exemplary Distributed Ledger Technology (DLT)-based Virtual Permitting Process (VPP) in accordance with embodiments of the present disclosure.

In various embodiments of an exemplary VPS system, a DLT framework for virtual permitting process includes a main blockchain that connects to other external blockchain networks. The main network handles some of the key steps for an exemplary Virtual Permitting System in accordance with embodiments of the present disclosure. An exemplary DLT framework can store regulatory texts and BIM model data off-chain and facilitate the chaincode to function as a model checker algorithm (that verifies BIM model data, reports results to appropriate parties, and carries out other inspection-related duties in accordance with the present disclosure), such as conducting variance analysis of permitted (approved) plans and actual, onsite construction phases (e.g., during foundation, framing, etc.). The details of aspects of this DLT-based VPS are shown in FIG. 3 and include:

(i) The regulations upon which the BIM model data or any other CAD (Computer Aided Design) file format, such as Autodesk Revit Formats (RVT, RFA), Autodesk DWG, DXF (Drawing Exchange Format), STL (Stereolithography), PDF (portable document format), or IFC (Industry Foundation Classes) data files, are to be assessed must be handled using computable expressions. A Smart Contract (chaincode) can be programmed to process the rules from a natural language using a Generalized Adaptive Framework (GAF) (Nawari, 2020) and Artificial Intelligence techniques such as Machine Learning (ML), Natural Language Processing (NLP), Image Processing. As such, Smart Contracts (SCs) can employ machine learning, natural language processing (NLP), computer vision, and fuzzy logic techniques performed by at least one processor. Additional details for an exemplary embodiment of the GAF framework and/or other components of the present application are provided in U.S. Provisional Patent Application, having Ser. No. 63,143,368, filed Jan. 29, 2021, which is entirely incorporated herein by reference. This chaincode can be implemented to incorporate all clauses, terms, and variables used in the building codes and regulations. Following the building regulations' transformation, the chaincode can generate a second appended smart contract that can be used by the model checker service;

(ii) The design data can be in BIM model data which can be stored in an if cXML format, or any other CAD (computer Aided Design) file format, such as Autodesk Revit Formats (RVT, RFA), Autodesk DWG, DXF (Drawing Exchange Format), STL (Stereolithography), PDF (portable document format), or IFC (Industry Foundation Classes) data files. The design data model data can be accessed by the model checker service using a smart contract (SC) (Python, Javascript, Rust, C++, and Go);

(iii) A model compliance checking service is programmed in the form of another chaincode that can extract data from the design data model and, upon invoking, can verify the extracted data against the translated rules created in step (i);

(iv) The model checker invokes the code-checking process and creates another smart contract where the results are reported and sent to respective participants.

(v) The model compliance checking service executes SC to generate output reports to be sent to authorities to review and confirm the final permit status. Chief Authorities can be on a separate blockchain network to issue the building permit; and (vi) To reliably connect with external blockchains, a secure gate of Decentralized Network (DN) can be utilized.

While government authorities in the United States are still struggling to cope with the high demand for issuing land development and civil infrastructure permits, automating or semi-automating the process reliably and securely offers a solution to this problem. The DLT is exemplified by a disseminated, decentralized ledger of data, resources, and data exchanges that have been processed and distributed among participants in a network system. Also, DLT offers immutable transparency, stresses reliability and trust between all participants on the network. Such characteristics can be beneficial in minimizing current limitations with the BIM-based permitting process.

Various DLT platforms are currently available for different applications. However, the Hyperledger Sawtooth (HLS) is highly suitable for enhancing the BIM-based building permitting process. These platforms are created with secure privacy in mind to ensure that various organizations and industries can take advantage of a DLT in different use-cases. A distinct feature of HLS is that it can sustain numerous ledgers within their network. This is a crucial aspect, which separates HLS from other DLT platforms.

Figure 4:
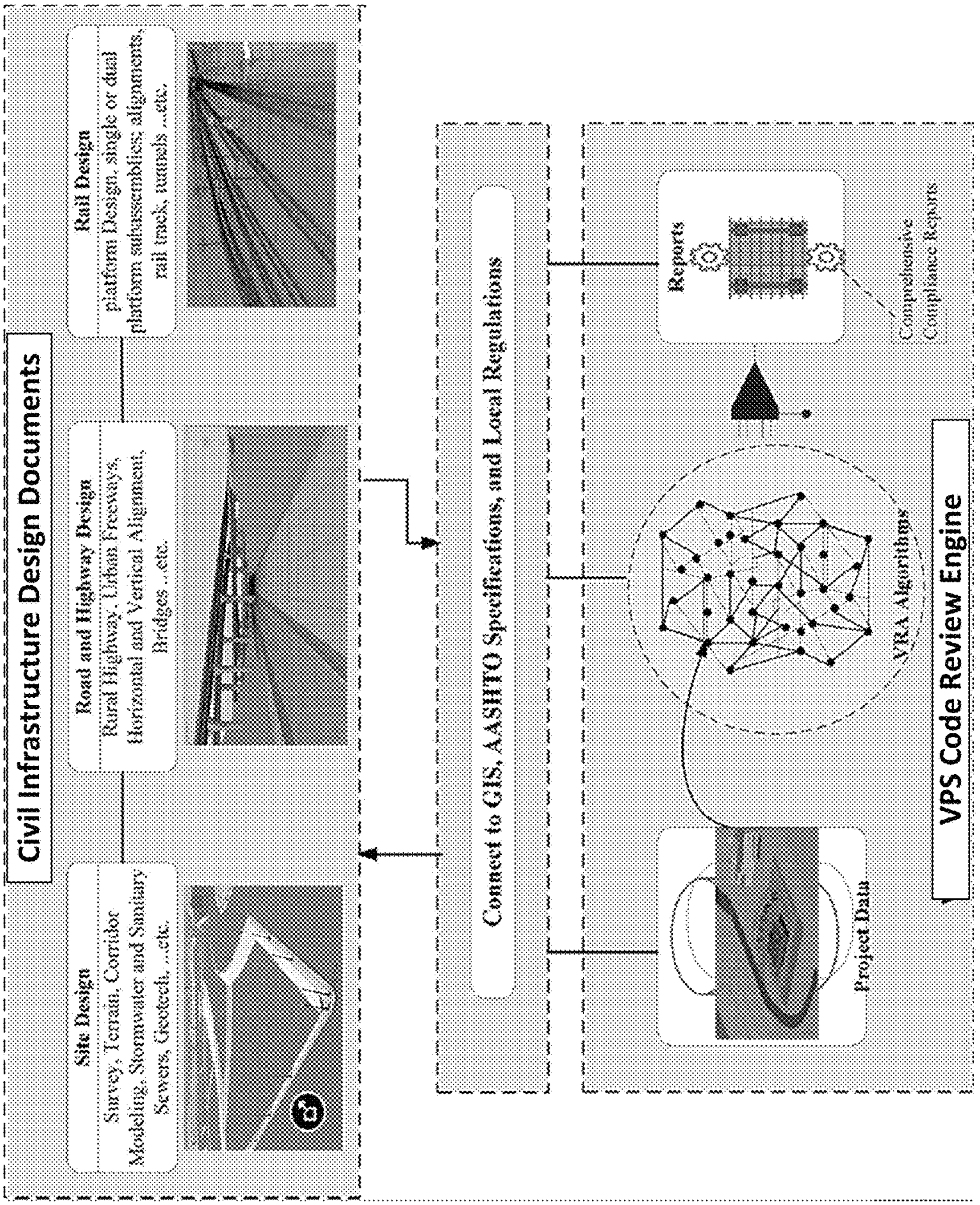
FIG. 4 illustrates a computing environment comprising a database of civil infrastructure design documents in accordance with various embodiments of the present disclosure.

An exemplary blockchain network framework aims to incorporate DLT using HLS with the BIM-based virtual permitting process to strengthen collaboration and trust, cybersecurity, responsibility, and data transaction integrity. The disclosed framework aims to reduce time to issue building permits and building inspection while maintaining transparency, trust, and accountability. For example, in the case of a civil infrastructure permitting system, FIG. 4 illustrates a computing environment comprising a database of civil infrastructure design documents coupled to database of GIS, AASHTO specifications, and local regulations which is coupled to a Code Review Engine of a VPS system, which accepts the project data as input, analyzes the project data using VPS algorithms, and generates/outputs comprehensive compliance reports.

An exemplary method for automated inspection of code conformance can automate a permit compliance review process by having Applicants upload their permit application file (as represented in a Building Information Model (BIM) data, or any other CAD (Computer Aided Design) file format, such as PDF, Autodesk DWG, DXF, IFC, etc.) to a blockchain network and comparing the uploaded file versus the state/local code and regulations. This type of process can involve an interpretation process where the semantic structure of each regulation is translated into object rules or parametric models using certain formal languages and stored as a smart contract and associated with the design data model which can be in different data format files such as BIM, or any other CAD (computer Aided Design) file format, such as PDF, Autodesk DWG, DXF, IFC, etc. data files, being examined. With a permit application having a design data model for a land development or construction project, the design data model can be used to extract relevant details for a project that is modeled in BIM or any other CAD (computer Aided Design) file format, such as PDF, Autodesk DWG, DXF, or IFC data files. In various embodiments, an exemplary permit application having BIM data includes spatial relationships of the project design, quantities & properties of components, and enables a wide range of project details that can be checked against applicable codes and regulations, since the BIM model defines objects as parameters and relations to other objects and carrying object attributes that specify pertinent details about the objects.

To start an exemplary permit review process, an Applicant can upload a permit application to a blockchain network, and the application can be prescreened to verify that the application is in the correct format, contact information is provided for the Applicant, or to verify other information that does not require detailed analysis or expert analysis of the contents of the application file. After the prescreening review is approved and completed, then the permit application file can be analyzed in subsequent stages or phases of the review process in accordance with smart contract logic. As part of this analysis, a previously stored version of the permit application file may be retrieved and compared against an updated version of the permit application file, such as that containing a point cloud data model of an actual and constructed design of the respective project. Upon completion of the review and analysis, the Applicant may be notified by the blockchain that corrections are required and additional information will need to be reviewed or if the inspection or review has been approved, as depicted in the figure.

Figure 5:
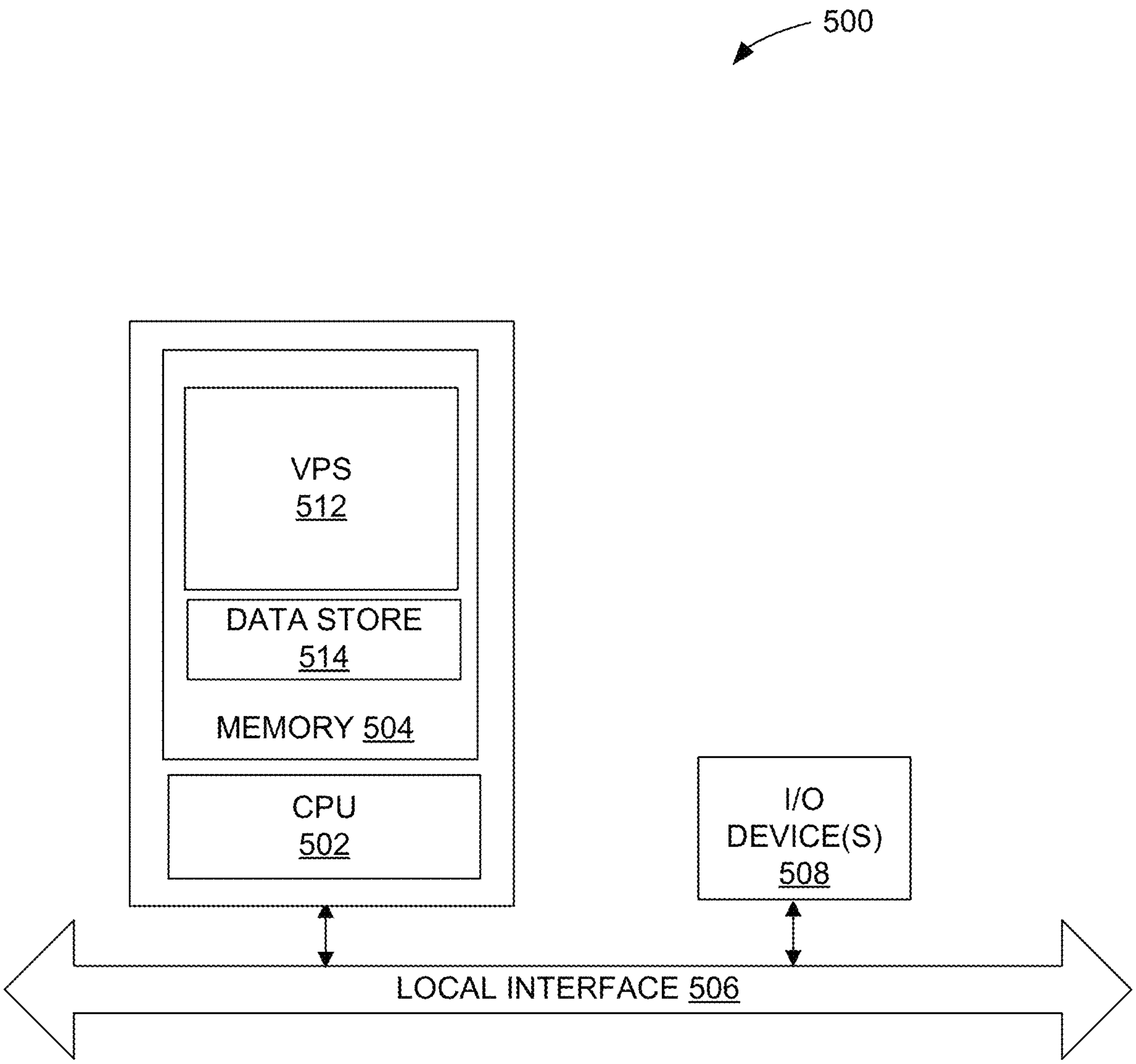
FIG. 5 shows a schematic block diagram of a computing device that can be used to implement various embodiments of the present disclosure.

FIG. 5 depicts a schematic block diagram of a computing device 500 that can be used to implement various embodiments of the present disclosure. An exemplary computing device 500 includes at least one processor circuit, for example, having a processor (CPU) 502 and a memory 504, both of which are coupled to a local interface 506, and one or more input and output (I/O) devices 508. The local interface 506 may comprise, for example, a data bus with an accompanying address/control bus or other bus structure as can be appreciated. The CPU 502 can perform various operations described herein.

Stored in the memory 504 are both data and several components that are executable by the processor 502. In particular, stored in the memory 504 and executable by the processor 502 are code 512 for implementing VPS operations as described herein. Also stored in the memory 504 may be a data store 514 and other data. The data store 514 can include a database for Building Information Model (BIM) data, computable records of codes & regulations, stored permit applications, and potentially other data. In addition, an operating system may be stored in the memory 504 and executable by the processor 502. The I/O devices 508 may include input devices, for example but not limited to, a keyboard, mouse, communication adapters and/or transceivers, etc. Furthermore, the I/O devices 508 may also include output devices, for example but not limited to, a printer, display, etc.

In accordance with embodiments of the present disclosure, exemplary systems and methods for automated determination of land development and/or civil infrastructure code performance are provided. The systems and methods described use a new system for a standard computable representation of land development and civil infrastructure codes that are compatible with an open data standard. Previously existing approaches for automated rules compliance verification are either based on proprietary frameworks, domain-specific areas, or hard-coded rule-based expressions. While these approaches may be useful in their specific implementations, they have the disadvantages of being costly to sustain, difficult to modify, and the absence of a generalized framework of rules and regulations modeling that can adjust to different domains—thus, they are not compatible with an open data standard. Furthermore, the existing approaches do not have the means to deal with subjective and ambiguous regulations, and they have not endured the test of industry applications.

An exemplary method for automated determination of land development and civil infrastructure code, ordinances, and regulatory checking can automate a permit process by having Applicants upload their applicable permit application file, e.g., as represented in a Building Information Model (BIM) or any other CAD (computer Aided Design) file format, such as Autodesk DWG, DXF, or IFC data files, PDF data, etc. to a platform, which can be configured to compare the information contained in the uploaded file to the state/local codes and regulations. The results of the comparison, and any issue flagged can then be presented as output, e.g., to user system. Further, the comparison results can be used to preliminarily approve the permit, e.g., the results will have to be briefly reviewed by a government staff. In fact, the BIM, CAD or PDF files and/or the results can be sent to the government authority.

In order to perform the comparison, the codes and regulations must undergo an interpretation process where the semantic structure of each regulation is translated into object rules or parametric models, using certain formal languages, and associated with the land development permit application file data being examined. This data can then be compared to the rules and models, or stated another way the rules and model can be applied to the data, and deficiencies noted. In an non-limiting example, the BIM or CAD model or PDF document defines objects as parameters and relations to other objects and carrying object attributes that specify pertinent details about the objects. For example, the BIM or CAD or PDF data can include spatial relationships of the land development and/or civil infrastructure design, quantities and properties, and a wide range of land development and/or civil infrastructure details including details on zoning, landscaping, drainage, sanitation, wetland controls, etc. that can be checked against applicable codes, ordinances, and regulations. Automated determination of land development and/or civil infrastructure code, ordinances, and regulatory checking can include a variety of regulations, such as site zoning & development, utilities, infrastructure, etc.

In accordance with various embodiments of the present disclosure, an exemplary framework for automated determination of land development and civil infrastructure code, ordinances, and regulatory checking has at least two main phases. The first phase develops the theoretical background for transforming the written provisions and guidelines of applicable land development and/or civil infrastructure codes and regulations into a computable representation. Accordingly, the first phase involves an interpretation process where the semantic structure of each regulation is translated into object rules or parametric models using certain formal languages. The first phase can be implemented via an exemplary VPS system.

The second phase specifies the various components required for the computerization of the code, ordinances, and regulatory checking process. Additional phases are focused on developing code for the data exchanges between the elements of the framework to perform the computerized evaluation process of land development and civil infrastructure plans to achieve compliance.

Figure 6:
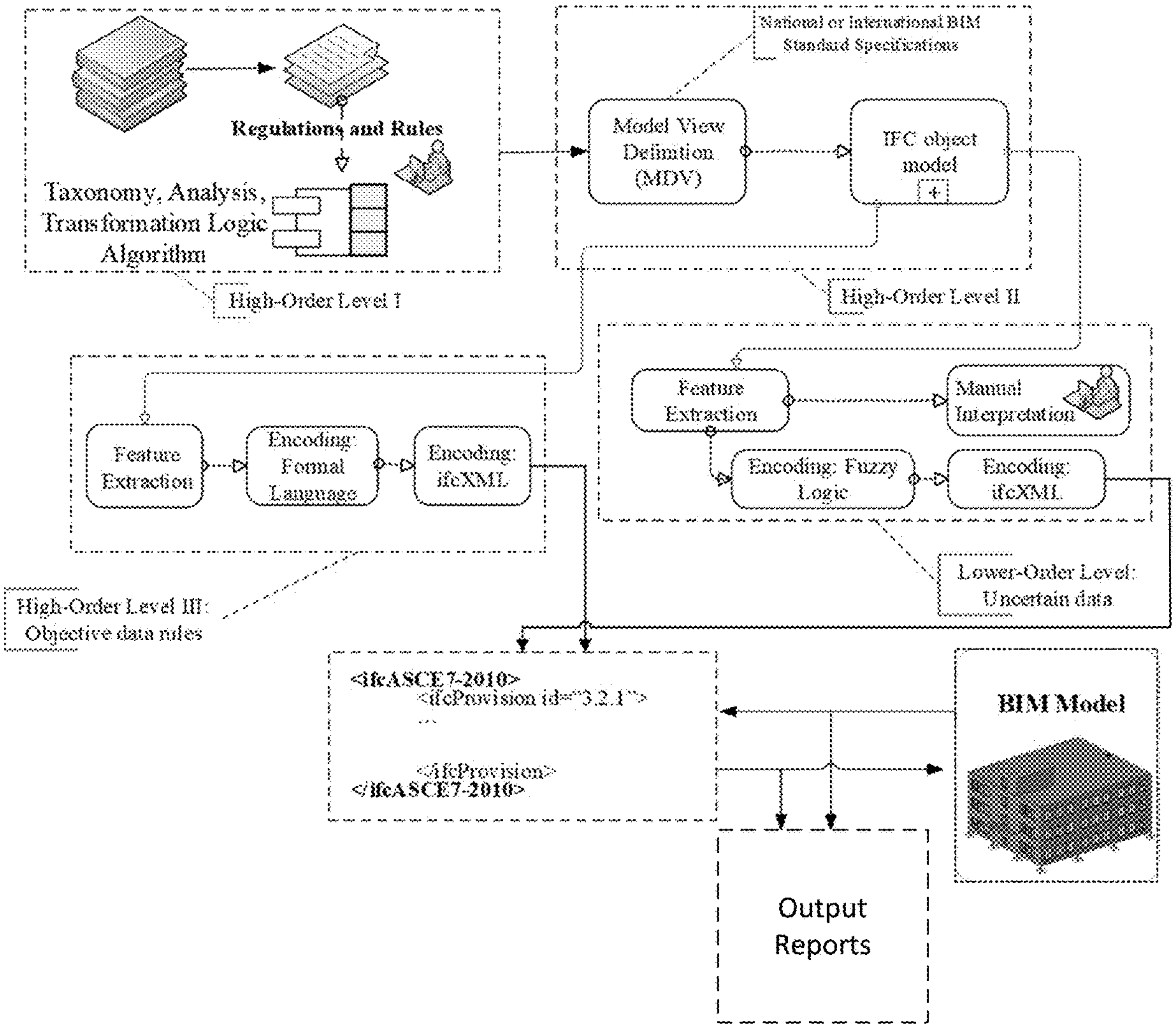
FIG. 6 shows an exemplary generalized adaptive framework for automated determination of land development and civil infrastructure code performance in accordance with various embodiments of the present disclosure.

In particular, the second phase centers on development levels for the computable code. In various embodiments, the development levels include:

(i) High-Order Level I: Classification of regulatory text into four main categories: conditional; content; ambiguous; and dependent;

(ii) High-Order Level II: Requires the Development of Model View Definition (MVD), leading to IFC (Industrial Foundation Classes) schema;

(iii) Higher-order level III: Requires feature extraction of all specific objective data leading to full encoding of object rules/models; and (iv) Lower-order level: Necessitates feature extraction of uncertain data, then employing partial encoding using fuzzy logic and approximate reasoning methods as well as neural Natural Language Processing (NLP) techniques, deep neural network-style machine learning/Artificial Intelligence, as represented in an exemplary Generalized Adaptive Framework (GAF) for Automated Review of FIG. 6.

Figure 7:
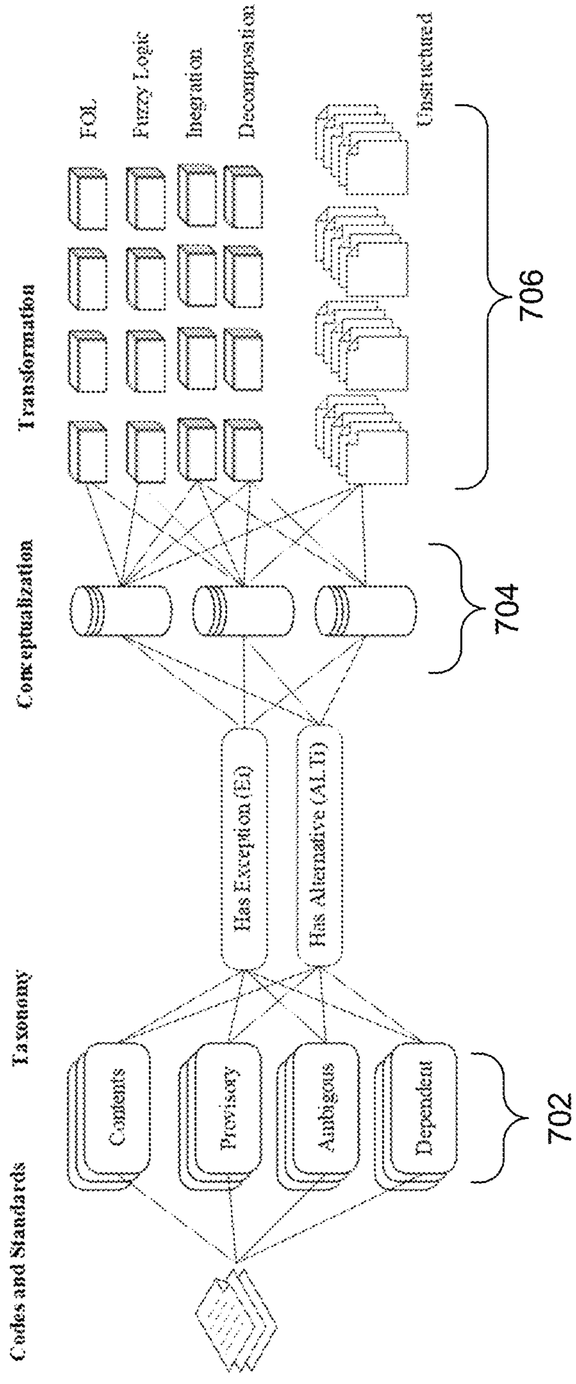
FIG. 7 shows an overview of the Transformation Logic Algorithm (TLA) in accordance with various embodiments of the present disclosure.

High-Order Level I involves taxonomy formation, data analysis including partitioning and classification of regulatory text into broad categories (e.g. content; conditional or provisory; ambiguous; dependent), and the development of Transformation Logic Algorithm (TLA). Accordingly, FIG. 7 shows an overview of the high-order level I phase. A first stage of the process of FIG. 7 involves the classification, in step 702, of land development codes and standards into a taxonomy category. In the example of FIG. 7, there are 4 categories: concepts, provisory, ambiguous, and dependent. The taxonomy categories can then be conceptualized in step 704, and transformed into a logical rule based on the selected category in step 706. In various embodiments, the logical rule can be stored in a rules and regulations data file comprises a computable data model defining land development codes and regulations. An exemplary system uses neural NLP techniques and/or deep neural network-style machine learning/artificial intelligence.

The TLA is based partially on first-order logic calculus. For example, an exemplary code provision that says, "only Professional Engineer (PE) must approve structural design" can be stated as following using TLA:

$$Prov\ (PE) \in \text{Conditional};$$

$$\forall x\ (PE(x) \rightarrow \text{Permitted}\ (x, \text{approve design}));$$

$$\forall x\ (\neg\, PE(x)\ \forall x\ \neg\, \text{Permitted}\ (x, \text{approve design})).$$

Additional and non-limiting illustrative TLA examples (Nawari, 2012) are shown below:

(i) An object is a member of a category: 4×8 S4S∈Wood Beams;

(ii) A category is a subclass of another category: Wood Beams⊂Beams (iii) All members of a category have some properties: x∈Wood Beams→Rectangular (x).

Members of a category can be recognized by some properties:

$$DouglasFir(x) \wedge \text{Square}(x) \wedge \text{Side}(x) = 9.25" \wedge \times \in \text{Beams} \rightarrow x \in \text{Wood Beams}.$$

The syntax used in the above statements has similar definitions as in first-order logic calculus. The definitions of the syntax used are summarized in Table 1 (Syntax of Transformation Logic Algorithm (TLA)) (below).

TABLE 1

| SYMBOL | DEFINITION |
|---|---|
| :: = | Is defined as |
| $\wedge$ | Conjunction |
| $\vee$ | Disjunction |
| $\subset$ | Subset of |
| $\neg$ | Negation |
| $\forall$ | Universal Quantifier |
| $\exists$ | Existential Quantifier |
| $\in$ | Belongs to |
| $\rightarrow$ | Implication |
| $\leftrightarrow$ | Biconditional |
| $\Rightarrow$ | Transform into |
| $::\Rightarrow$ | Depends upon |
| Constant | String starting with an uppercase letter |
| Variable | String starting with a lowercase letter |
| Pred (arg1, arg2, . . .) | Predicate |
| Fun (arg1, arg2, . . .) | Function |
| Pred(arg1, arg2, . . .) ^ Pred2(arg1, arg2) ∨ . . . | Rule |

Table 1

This TLA algorithm can be illustrated further by considering an exemplary and non-limiting Regulation Code—Residential 2020 (FBC 2020). FIG. 8 depicts parts of section 304 from the FBC 2020-Residential. The provision shown in FIG. 8 can be transformed into computable representation using the TRA as follows:

Let $REG_i$="Section R304"; Where i varies from 1 to n number of code provisions. Then we have $$REG_i \in P_i \Rightarrow Y_i \Rightarrow X_i \quad (1)$$

Where the subscript i stands for the counts of the code sections being processed and varies from 1 to n sections;

$P_i$ designates that this is a provisory clause, and describes the minimum room area ($Y_i$) which is given by $X_i$ that expresses the various Rules describing $Y_i$:

$$X_i = \{R_1, R_2, \ldots R_m\}, \quad (2)$$

Where $R_1$, $R_2$, . . . $R_m$ are the rules defining $X_i$;

$$\text{Let } Z_{1j} = (z_{11} \ldots z_{1q}\}; \quad (3)$$

$$z = IfcSpace;\ z_{11} = \quad (4)$$

$$\text{"}R304.1\text{"; and } z_{12}::\ = \text{Floor area} >= 70\ \text{ft}^2(6.5\ \text{m}^2);$$

$$R_2\text{: } \forall z\ (REG_i(z) \rightarrow \quad (5)$$

$$MinimumArea(z,\ Z_{1j}) \wedge \neg SpaceName(z, \text{KITCHEN};)$$

$$Z_{2j} = \{z_{21} \ldots z_{2q}\}; \quad (6)$$

Where $z_{21}$="R304.2"; and $z_{22}$::=least horizontal dimension of any habitable room >=7 ft (2.134 m);

$$R_3\text{: } \forall z\ (REG_i(z) \rightarrow \quad (7)$$

$$MinimumDimension(z,\ Z_{2j}) \wedge \neg SpaceName(z, \text{KITCHEN});$$

$$Z_{3j} = \{z_{31} \ldots z_{3q}\}; \quad (8)$$

Where $Z_{31}$="R304.3"; $z_{32}$::=Ceiling height >5 ft for sloped ceiling; and $z_{33}$:: =Ceiling height >7 ft for furred ceiling;

$$R_4\text{: } \forall z\ (REG_i(z) \rightarrow CeilingHeightLimitation(z,\ Z_{3j}); \text{ and} \quad (9)$$

$$X_i = \{R_1 \wedge R_2 \wedge R_3 \wedge R_4\}. \quad (10)$$

Equation 10 then represents the knowledge transformation process to generate computable model for the code specifications expressed in illustrative and non-limiting FBC 2020-Residential, section R304. Thus, all of the rules and regulations can be similarly translated into equations using the TLA.

Conditional clauses, such as above can be transformed directly from the textual format into set of rules. Examples of these are very common and typical features include rules with specific values. An illustrative and non-limiting regulatory example is provided by provision (3.2.1) for computing lateral pressure in the ASCE 7-10 Standard for minimum design loads for buildings and other structure. Contents clauses cannot be translated into a TRUE or FALSE statement. Instead of advising, these clauses are usually used for definitions, such as the definition of firewall, fire rate, smoke evacuation, high-rise building, etc. Ambiguous clauses are the subjective provisions. They normally include words such as: approximately, about, relatively, close to, far from, maybe, etc. An example is the footnote of the design lateral soil pressure for the clause given in provision (3.2.1), ASCE 7-10: "For relatively rigid walls, as when braced by floors, the design lateral soil load shall be increased for sand and gravel type soils to 60 psf (9.43 kN/m2) per foot (meter) of depth. Basement walls extending not more than 8 ft (2.44 m) below grade and supporting light floor systems are not considered as being relatively rigid walls." Dependent clauses indicate that one clause is dependent upon one or more other clauses. They represent deep hierarchies and massive cross-referencing among provisions in code regulations. This means some provisions are only suitable for a particular condition when other clauses are met. These are often difficult to convert into sets of rules and may require manual verification for compliance.

Referring back to FIG. 6, the higher-Order Level II phase of the exemplary GAF centers on the development of IDM (Information Delivery Manual) and MVD (Model View Definitions) that allows the land development and/or civil infrastructure permit application file data to be compared to the relevant codes and regulations. The development of IDM for land development and civil infrastructure code specifications starts with a description of data exchange functional requirements and workflow situations for interactions between land development and/or civil infrastructure permit application file data (e.g., BIM model data) and the conditions specified in land development and civil infrastructure codes. This is demonstrated in the process map of FIG. 6. An exemplary system uses neural NLP techniques and/or deep neural network-style machine learning/Artificial Intelligence.

The IFC schema encompasses a wide range of data objects. Thus, it is recommended that each discipline domain should only consider a subset of the full IFC schema to avoid processing an overwhelming amount of data. A Model View Definition (MVD) is developed as the tool for creating model subsets that are pertinent to the specific data exchange between domain application types. MVD diagram describes the concepts and attributes that will be used in the data exchange, as well as the schema and relationships between these concepts and attributes. In general, the exchange models are transformed from the IDM into various concepts. Each concept, in turn, is described with several attributes and relationships. The concluding phase is the translation of the MVD into implementation IFC entities, attributes, relationships and properties as required by the IFC schema.

The process of developing the MVDs counts on the description of the information exchange models (EMs) in the IDM and how they will be utilized, both with respect to domain users and software developers. From this information, the MVD is established for each attribute and describes how it is to be handled in the IFC schema. In essence, MVD offers the specification for IFC based data exchange implementation.

In various embodiments, a MVD can represent part of the exchanges for code checking and the land development plan. An exemplary MVD can provide the basis for developing MVD covering other parts of land development regulations and standards, which will enable high-quality IFC implementations that satisfy a design review process.

The development of the MVDs and EMs allows for certain objective aspects of the codes and regulations of the extracted and encoded in the High-order Level III phase. The Lower Order Level phase of an exemplary GAF framework introduces the method of transforming (step 706) ambiguous provisions into rules by applying an algorithm for partial transformation using first order logic (FOL), fuzzy logic, integration, decomposition, and approximate reasoning methods. Fuzzy logic offers ways of modeling linguistic rules in such a format that they can be integrated into a coherent logical schema (Nawari, 2019).

An illustrative and non-limiting example of vague design regulations can be found in Florida Building Code 2020-Residential (FBC 2020-R) section R322.1 In this provision, the regulations states:

> Buildings and structures constructed in whole or in part in flood hazard areas, including A or V Zones and Coastal A Zones, as established in Table R301.2(1), and substantial improvement and restoration of substantial damage of buildings and structures in flood hazard areas, shall be designed and constructed in accordance with the provisions contained in this section.

The word substantial is never defined precisely. Using an exemplary approach, then we have $$REG_1 = \text{“Section } R322.1\text{”; then we have } REG_1 \in (C_1 \cap A_1) \quad (11)$$

Where $REG_1$ is a variable for the regulation section, $(C_1 {}^\wedge A_1)$ designates that this is a content clause with ambiguous statements describing flood resistance construction. Now let $$REG_1 = \{R_1, R_2, \ldots R_m\} \quad (12)$$

where, $R_1, R_2, \ldots R_m$ are the rules defining $REG_1$. Next let $$Z_{1j} = \{z_{11}, \ldots, z_{1q}\};\ z = IfcBuilding;\ z_{11} = \text{“}FBC\ 2020-R322\text{”};\quad z_{12} = \text{“}ASCE\ 24\text{”}. \quad (13)$$

Now using logic notations, we have $$R_1: \forall z\ (InFloodZone(z) \rightarrow (RequiredProvision(z, z_{11}))); \quad (14)$$

$$R_2: \forall z\ (InFloodZone(z) \rightarrow (RequiredProvision(z, z_{12}))). \quad (15)$$

In terms of the conceptualization of the expression “substantial damage”, fuzzy logic and predicates will be employed to translate the concepts into a computable model. A fuzzy set is defined as (Zadeh, 1965): A is a fuzzy subset of the universe of discourse U, is characterized by a membership function $\mu_A$: U→[0 . . . 1] which associates with each element u of U a number μA (u) in the interval [0,1]. This description can be utilized to express fuzzy predicate (Nawari, 2018). The truth-value of any proposition can be estimated as the degree of membership of the corresponding fuzzy relation. Consequently, a fuzzy predicate can be described as the membership function of a fuzzy relation over individual variables' universe of discourse. Each fuzzy predicate signifies a concept in the GAF. For instance, the building damage described in section R322 of the FBC 2020-R can be modeled as a fuzzy variable. These involve small damage, medium damage, and substantial damage. Next, let $z_{i2}$=a fuzzy variable described as $$\left.\begin{array}{ll} \mu_A(u) = 0 & 80\% \le u \ge 0 \\ \mu_A(u) = \left(\frac{1}{15}\right)u - \frac{25}{15} & 80\% < u \ge 90\% \\ \mu_A(u) = 1 & u > 90\% \end{array}\right\} \quad (16)$$

$$\text{where } 0 < \mu_A(u) \le 1.$$

Finally, section R322 of the FBC 2020-Residential is transformed into the following rule:

$$R_3: \forall z\ (InFloodZone(z) \cap \text{Damage}\ (z, z_{12}) \rightarrow (RequiredProvision(z, z_{11}))) \quad (17)$$

Engineering design codes do have quite often such vague terms to describe certain conditions. Table 2 (below) summarizes some of these terms and their transformation using a fuzzy predicate.

TABLE 2

| No | Uncertain building code Terms | Conceptualization |
|---|---|---|
| 1 | The building has Some damage | Fuzzy predicate, $0 \le \mu_A(u) \le 1$ |
| 2 | The building has a good amount of damage | Fuzzy predicate, $0 \le \mu_A(u) \le 1$ |
| 3 | Building damage is extreme | Fuzzy predicate, $0 \le \mu_A(u) \le 1$ |
| 4 | A Substantial amount or a sizable amount | Fuzzy predicate, $0 \le \mu_A(u) \le 1$ |
| 5 | A fair amount or Moderate amount | Fuzzy predicate, $0 \le \mu_A(u) \le 1$ |
| 6 | Large value | Fuzzy predicate, $0 \le \mu_A(u) \le 1$ |

TABLE 2-continued

| No | Uncertain building code Terms | Conceptualization |
|---|---|---|
| 7 | Small amount | Fuzzy predicate, $0 \leq \mu_A(u) \leq 1$ |
| 8 | Very little or a little bit | Fuzzy predicate, $0 \leq \mu_A(u) \leq 1$ |

The fuzzy predicate may be defined as a relation with arguments, and the arguments may be constants or variable: Rel(u, A), where A is fuzzy set, Rel is a relation, and u is an element in the Universe of discourse U. For instance, "Building X damage is substantial." The fuzzy predicate is given by Damage(Building X, substantial) where "substantial" is fuzzy set, "Damage" is a relation and "Building X" is an individual element.

By integrating land development permit applications and related documents with building information modeling concepts, exemplary methods and systems can be employed to evaluate and check for compliance with such documents with applicable land development and/or civil infrastructure codes and regulations. Accordingly, in various embodiments, land development and civil infrastructure codes and regulations can be transformed into equivalent logic rules by which an input file can be assessed using artificial intelligence and machine learning via one or more artificial neural networks. An exemplary system uses neural NLP techniques and/or deep neural network-style machine learning/artificial intelligence. In various embodiments, the framework software can be installed on a central server that can be made available to various local municipalities to provide code compliance review and related services for the land development and/or civil infrastructure plans and related documents involving the municipalities and their constituents. In some embodiments, the framework software comprises a plug-in piece of software for an existing computer program. In accordance with the present disclosure, a land development and/or civil infrastructure permit application file standard can be established for the development of land development and/or civil infrastructure permit applications and computable records of land development and civil infrastructure code regulations. As such, a rule-based system, implemented via an artificial intelligence system or neural network, can be established to automatically check land development and/or civil infrastructure code conformance and other regulations. In various embodiments, the neural network can output prediction confidence data for its compliance review and/or classification of land development and/or civil infrastructure plan details. Any inaccurate prediction of code conformance can be fed back to the AI system for improved prediction in the future. To do so, the neural network may use supervised or unsupervised or other learning methods to improve accuracy of land development and/or civil infrastructure code conformance review of land development and/or civil infrastructure projects.

Certain embodiments of the present disclosure can be implemented in hardware, software, firmware, or a combination thereof. If implemented in software, VPS logic or functionality are implemented in software or firmware that is stored in a memory and that is executed by a suitable instruction execution system. If implemented in hardware, building construction inspection logic or functionality can be implemented with any or a combination of the following technologies, which are all well known in the art: discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Thus, one or more or more of the components described herein that includes software or program instructions can be embodied in any non-transitory computer-readable medium for use by or in connection with an instruction execution system such as a processor in a computer system or other system. The computer-readable medium can contain, store, or maintain the software or program instructions for use by or in connection with the instruction execution system.

The computer-readable medium can include physical media, such as, magnetic, optical, semiconductor, or other suitable media. Examples of a suitable computer-readable media include, but are not limited to, solid-state drives, magnetic drives, flash memory. Further, any logic or component described herein can be implemented and structured in a variety of ways. One or more components described can be implemented as modules or components of a single application. Further, one or more components described herein can be executed in one computing device or by using multiple computing devices.

It should be emphasized that the above-described embodiments are merely possible examples of implementations, merely set forth for a clear understanding of the principles of the present disclosure. Many variations and modifications may be made to the above-described embodiment(s) without departing substantially from the principles of the present disclosure.

For example, in accordance with various embodiments, systems and methods of the present disclosure enable virtual land development and civil infrastructure permitting. Such systems/methods go beyond automated code compliance checking and, after critical reviews and final building inspection, will generate occupancy certificates. In an exemplary implementation, among others, a permit officer can carry a portable computing device or tablet 120 loaded with visualization software (e.g., VRA Visualizer) that shows the various sections, plans, and compliance/non-compliance for site review/verification. Permit officers can mark his/her comments while at the site, including capturing pictures at the site and attaching them to the comments, as necessary. This will also be helpful in building code development and enforcement.

In accordance with various embodiments, systems and methods of the present disclosure enable artificial intelligence (AI) review, including natural language processing (NLP), multilayer perceptron (MLP), and genetic algorithms. Such systems/methods utilize the inputs gathered from model files and are configured to predict compliance and non-compliance by project types, area, and other characteristics. This will also be helpful in code development and enforcement. Moreover, AI-based approaches can be configured to learn (supervised/unsupervised with penalties) and apply code reviews. Additional details for embodiments of the artificial intelligence functionality and/or other components are provided in U.S. Provisional Patent Application, having Ser. No. 63,143,368, filed Jan. 29, 2021, which is entirely incorporated herein by reference In accordance with various embodiments, systems and methods of the present disclosure enable data visualization and exchange. Such systems/methods can check for non-compliance issues by overlaying or superimposing captured data on a design model and visualizing in 2D or 3D via a computing device (e.g., tablet device) by permit officials; support onsite permit official/developer/project manager visits (accessible via an exemplary computing device (e.g., tablet)); support developer staff to compare bill of materials, wastage quantities, etc.; support the training of AEC (Architecture, Engineering, and Construction) professionals, etc.

In accordance with various embodiments, systems and methods of the present disclosure enable a blockchain framework for virtual permitting and inspections. Such systems/methods can provide a permitting blockchain network and/or a virtual inspection blockchain network.

All such modifications and variations are intended to be included herein within the scope of this disclosure.

The invention claimed is:

1. A method comprising:

storing, by a computing device, land development design data in a building information model (BIM) file or a Computer Aided Design (CAD) file, wherein the BIM or the CAD file comprises a permit application file having a design for a land development project;

storing a second design data file for the land development project, wherein the second design data file comprises a second permit application file having a design for a civil infrastructure project related to the land development project;

acquiring zoning, planning, landscape, environmental, utilities, storm water and drainage, water supply and wastewaters, photometric, and road design details of the land development from the second design data file;

acquiring a current progress of the land development details from the second design data file; and checking for current land development code compliance by comparing the current progress with the land development details from a rules and regulations data file; wherein the computing device comprises one or more blockchain nodes, wherein the rules and regulations data file is stored by the one or more blockchain nodes in a distributed ledger network, wherein the rules and regulations data file comprises a computable data model defining land development codes and regulations;

checking, by the computing device, the permit application file for code compliance with computable files defining land development codes;

generating, by the computing device, an output report indicating whether the permit application file has passed a check for the code compliance; and transmitting, by the computing device, the output report to a client device of an applicant associated with the permit application file.

2. The method of claim 1, wherein the computing device comprises a blockchain node, wherein the land development design data file is stored by one or more blockchain nodes in a distributed ledger network, wherein the permit application file is checked for code compliance in accordance with one or more Smart Contracts (SCs) of the distributed ledger network.

3. The method of claim 1, further comprising storing, by the computing device, a rules and regulations data file for the land development project, wherein the rules and regulations data file comprises a computable data model defining land development codes and regulations.

4. The method of claim 3, wherein the computing device comprises one or more blockchain nodes, wherein the land development design data in the BIM or CAD file and the rules and regulation data file are stored by the one or more blockchain nodes in a distributed ledger network.

5. The method of claim 1, wherein the checking operation is performed using artificial intelligence techniques.

6. The method of claim 1, wherein a format of the BIM or CAD file comprises an Autodesk Revit format, an Autodesk DWG format, a DXF (Drawing Exchange Format) format, a STL (Stereolithography) format, a PDF (portable document format) format, or an IFC (Industry Foundation Classes) data format.

7. A system comprising:

at least one processor; and memory configured to communicate with the at least one processor, wherein the memory stores instructions that, in response to execution by the at least one processor, cause the at least one processor to perform operations comprising:

storing, by a computing device, a design data file for a land development project, wherein the design data file comprises a BIM file or a CAD (Computer Aided Design) file, wherein the design data file comprises a permit application file having a design for the land development project;

storing a second design data file for the land development project, wherein the second design data file comprises a second permit application file having a design for a civil infrastructure project related to the land development project;

acquiring zoning, planning, landscape, environmental, utilities, storm water and drainage, water supply and wastewaters, photometric, and road design details of the land development from the second design data file;

acquiring a current progress of the land development details from the second design data file; and checking for current land development code compliance by comparing the current progress with the land development details from a rules and regulations data file; wherein the computing device comprises one or more blockchain nodes, wherein the rules and regulations data file is stored by the one or more blockchain nodes in a distributed ledger network, wherein the rules and regulations data file comprises a computable data model defining land development codes and regulations;

checking, by the computing device, the permit application file for code compliance with computable files defining land development codes;

generating, by the computing device, an output report indicating whether the permit application file has passed a check for the code compliance; and transmitting, by the computing device, the output report to a client device of an applicant associated with the permit application file.

8. The system of claim 7, wherein the computing device comprises one or more blockchain nodes, wherein the design data file is stored by the one or more blockchain nodes in a distributed ledger network, wherein the permit application file is checked for code compliance in accordance with one or more Smart Contracts (SCs) of the distributed ledger network.

9. The system of claim 7, wherein the operations further comprise storing a second design data file for the land development project, wherein the second design data file comprises a second permit application file having a design for a civil infrastructure project related to the land development project.

10. The system of claim 9, wherein the operations further comprise checking the second permit application file for code compliance with computable files defining land development codes.

11. The system of claim 7, wherein the computing device comprises one or more blockchain nodes, wherein a rules and regulations data file is stored by the one or more blockchain nodes in a distributed ledger network, wherein the rules and regulations data file comprises a computable data model defining land development codes and regulations.

12. The system of claim 11, wherein the design data file and the rules and regulations data file are stored by the one or more blockchain nodes in the distributed ledger network.

13. The system of claim 7, wherein the checking operation is performed using Smart Contracts (SCs) that employ machine learning, natural language processing (NLP), computer vision, and fuzzy logic techniques performed by the at least one processor.

14. A non-transitory, tangible computer-readable storage medium having instructions stored thereon that, in response to execution by a computer-based system, cause the computer-based system to perform operations comprising:

storing a design data file for a land development project, wherein the design data file comprises a BIM file or a CAD (Computer Aided Design) file, wherein the design data file comprises a permit application file having a design for the land development project;

storing a second design data file for the land development project, wherein the second design data file comprises a second permit application file having a design for a civil infrastructure project related to the land development project;

acquiring zoning, planning, landscape, environmental, utilities, storm water and drainage, water supply and wastewaters, photometric, and road design details of the land development from the second design data file;

acquiring a current progress of the land development details from the second design data file; and checking for current land development code compliance by comparing the current progress with the land development details from a rules and regulations data file; wherein the computing device comprises one or more blockchain nodes, wherein the rules and regulations data file is stored by the one or more blockchain nodes in a distributed ledger network, wherein the rules and regulations data file comprises a computable data model defining land development codes and regulations;

checking the permit application file for code compliance with computable files defining land development codes;

generating an output report indicating whether the permit application file has passed a check for the code compliance; and transmitting the output report to a client device of an applicant associated with the permit application file.

15. The non-transitory, tangible computer-readable storage medium of claim 14, wherein the operations further comprise storing the design data file in a distributed ledger network, wherein the permit application file is checked for code compliance in accordance with one or more Smart Contracts (SCs) of the distributed ledger network.

16. The non-transitory, tangible computer-readable storage medium of claim 14, wherein the operations further comprise storing a second design data file for the land development project, wherein the second design data file comprises a second permit application file having a design for a civil infrastructure project related to the land development project.

17. The non-transitory, tangible computer-readable storage medium of claim 16, wherein the operations further comprise checking the second permit application file for code compliance with computable files defining land development codes.

18. The non-transitory, tangible computer-readable storage medium of claim 14, wherein the operations further comprise storing a rules and regulations data file in a distributed ledger network, wherein the rules and regulations data file comprises a computable data model defining land development codes and regulations.

* * * * *